United States Patent
Kim

(10) Patent No.: US 7,631,281 B2
(45) Date of Patent: Dec. 8, 2009

(54) METHOD FOR MODELING VARACTOR BY DIRECT EXTRACTION OF PARAMETERS

(75) Inventor: Sung-Moo Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/964,484

(22) Filed: Dec. 26, 2007

(65) Prior Publication Data

US 2008/0177514 A1    Jul. 24, 2008

(30) Foreign Application Priority Data

Dec. 29, 2006    (KR) .................. 10-2006-0137299

(51) Int. Cl.
*G06F 17/50* (2006.01)
(52) U.S. Cl. .................. 716/4; 716/5; 716/6; 703/2
(58) Field of Classification Search ............. 716/14–16; 703/2
See application file for complete search history.

(56) References Cited

U.S. PATENT DOCUMENTS

| 4,525,678 A | * | 6/1985 | Lehmann et al. | ............. 330/277 |
| 2005/0216873 A1 | * | 9/2005 | Singh et al. | .................... 716/5 |

* cited by examiner

*Primary Examiner*—Naum B Levin
(74) *Attorney, Agent, or Firm*—Sherr & Vaughn, PLLC

(57) ABSTRACT

A method for modeling a varactor with a MOS structure, and transforms an s-parameter obtained by the measurement using measurement equipment into a y-parameter and a z-parameter and then directly extracts parameters required for the modeling by means of equations in accordance with embodiments. The modeling can be made reflecting the parameters of the varactor varied according to frequency so that the more accurate RF modeling of a passive device can be made and the accurate modeling of the varactor can be made through the direct extraction method of the parameters so that the parameters of the varactor having a physical meaning can be extracted without using an expensive CAD tool, the time required for optimizing the parameters can be reduced, a computing time can be shorten, an initial condition dependence generated in performing the optimization is not required, and a pattern for a test is not required.

18 Claims, 11 Drawing Sheets

Figure 1:
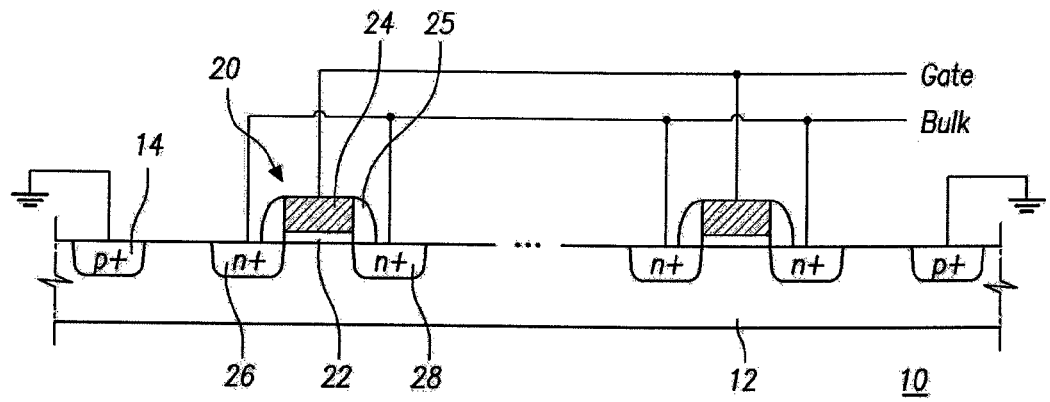

S(4, 4)
S(4, 3)
S(3, 3)
S(3, 1)
S(2, 2)
S(1, 2)
S(1, 1)

freq (100.0MHz to 10.10GHz)

freq (100.00MHz to 10.10GHz)

METHOD FOR MODELING VARACTOR BY DIRECT EXTRACTION OF PARAMETERS

The present application claims priority under 35 U.S.C. 119 to Korean Patent Application No. 10-2006-0137299 (filed on Dec. 29, 2006), which is hereby incorporated by reference in its entirety.

BACKGROUND

The process of manufacturing a semiconductor integrated circuit (IC) device may be very complicated and expensive. Therefore, prior to actually manufacturing the IC device, the IC device may be subjected to a simulation process verifying that it is operated according to a specified design. The most representative program used for an operation simulation of a circuit is a simulation program with integrated circuit emphasis (SPICE). The SPICE simulates a circuit model by using equations mathematically defining the operation of several circuit devices included in the circuit design and then provides the results as verification information. In order to simulate the circuit, various devices should be modeled. For this, a Berkeley short-channel (BSIM) insulated-gate field effect transistor (IGFET) has been the most widely used.

A varactor may be implemented having a MOS structure in a semiconductor integrated circuit device. Such a MOS varactor may have a high Q index and may occupy a small area when compared to a pn junction-type varactor. The MOS varactor may be used as an LC tank of a voltage controlled oscillator (VCO) for generating different VCO oscillating frequencies. The MOS varactor is one of important RF passive devices such as an analog filter, a switch capacitor circuit, a data converter, an RF circuit, and the like that may be applied to various fields. Since the characteristics of the MOS varactor may be varied according to the operating frequency, a physical geometry of the device, and a bias condition, an RF modeling is important.

However, in the modeling of the varactor, since the real component of impedance may be determined by the serial connection of R, L, and C, it may have a value that is not varied according to frequency. However, the real component in the actual measured value of impedance may vary according to frequency. The existing modeling method cannot explain this change. Accordingly, since it may be difficult to accurately model the device, the operation prediction of the circuit may not be accurate.

Moreover, optimally modeling the varactor using a CAD tool may be time-consuming and incurs a great deal of expense.

SUMMARY

Embodiments relate to a method for modeling a varactor, and more particularly to an RF modeling method of a varactor through a direct extraction method of parameters for explaining the parameters of the varactor varied according to frequency. Embodiments relate to an accurate RF modeling method of a varactor. Embodiments relate to an RF modeling method capable of explaining the change of parameters in a varactor according frequency. Embodiments relate to reducing the time required to extract parameters of a varactor having a physical meaning and optimize the parameter without using an expensive CAD tool.

DRAWINGS

Example FIG. 1 illustrates a varactor, in accordance with embodiments.

Figure 2:
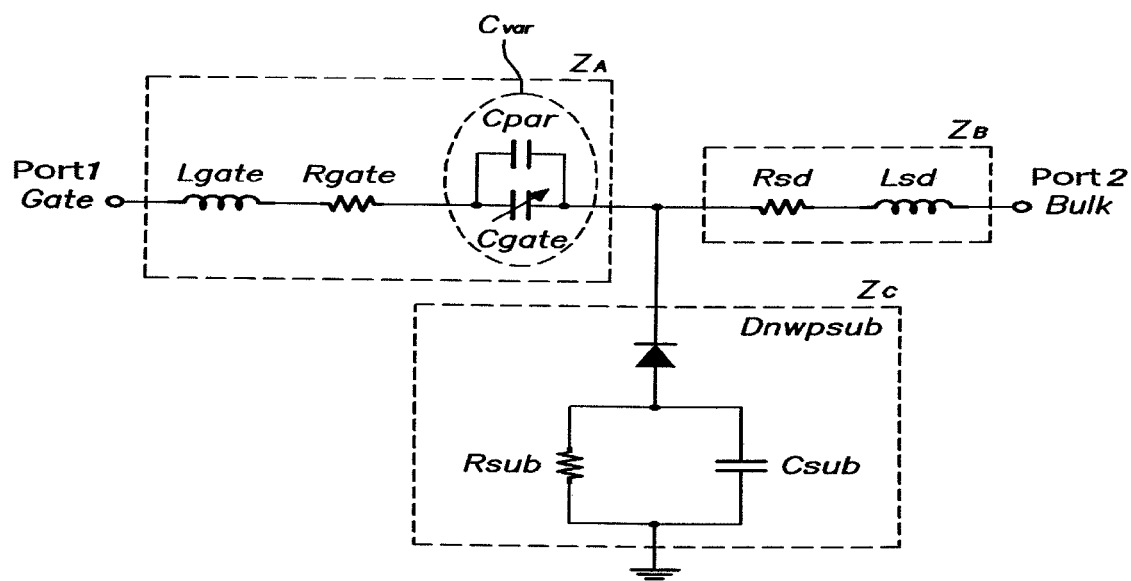

Example FIG. 2 illustrates an equivalent circuit diagram of a varactor, in accordance with embodiments.

Figure 3A:
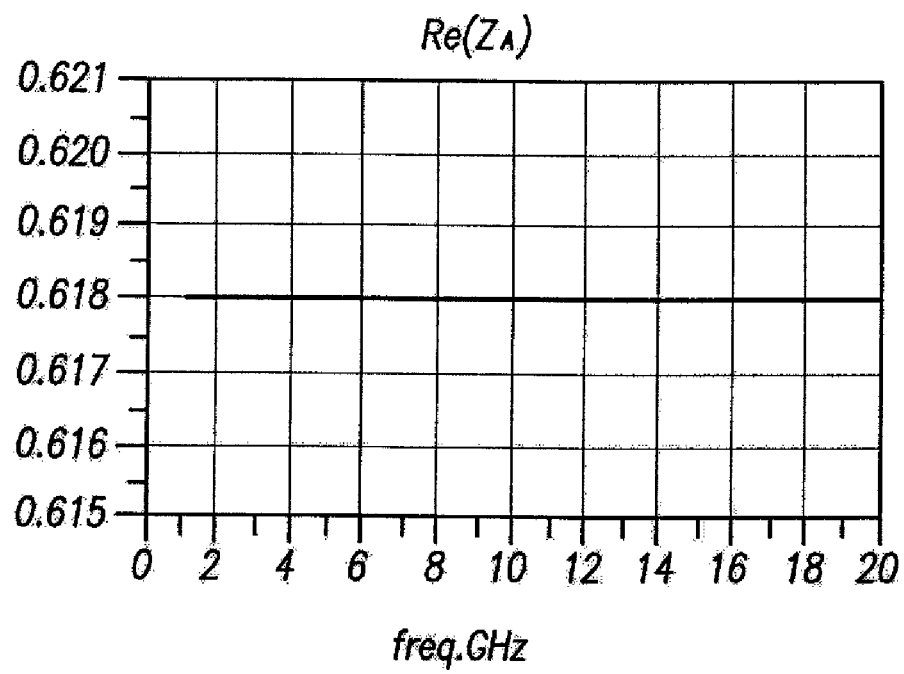

Example FIG. 3A illustrates a real component $Re(Z_A)$ of port 1 gate impedance $Z_A$ obtained through a parameter direction extraction method, in accordance with embodiments.

Figure 3B:
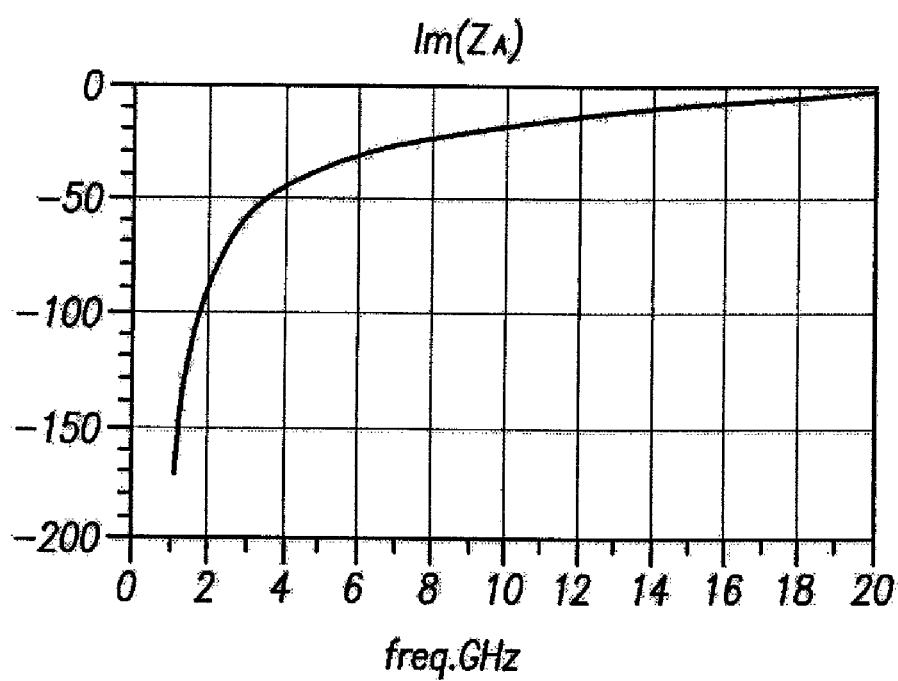

Example FIG. 3B illustrates an imaginary component $Im(Z_A)$ of port 1 gate impedance $Z_A$ obtained through a parameter direction extraction, in accordance with embodiments.

Figure 4A:
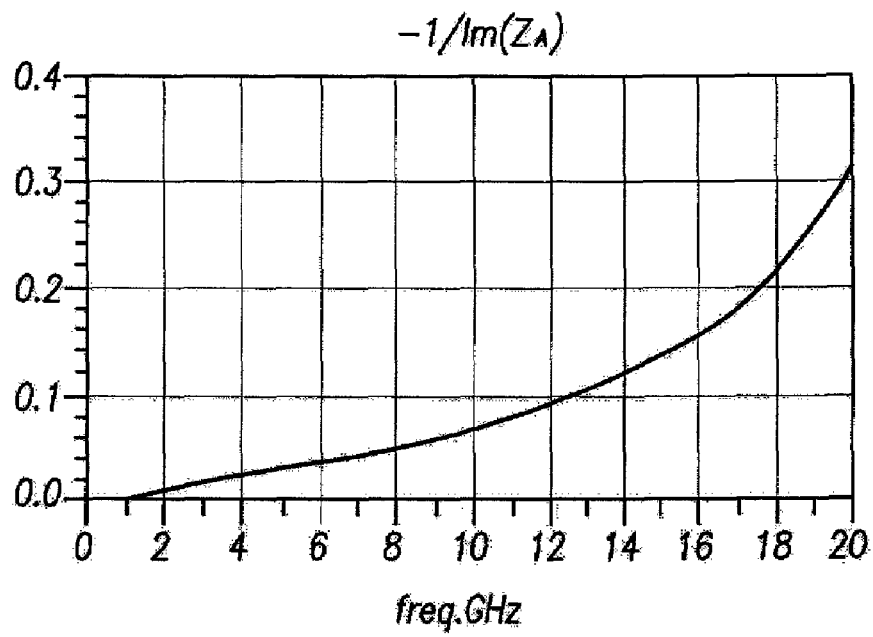

Example FIG. 4A illustrates $-1/Im(Z_A)$ of port 1 gate impedance $Z_A$ obtained through a parameter direction extraction method, in accordance with embodiments.

Figure 4B:
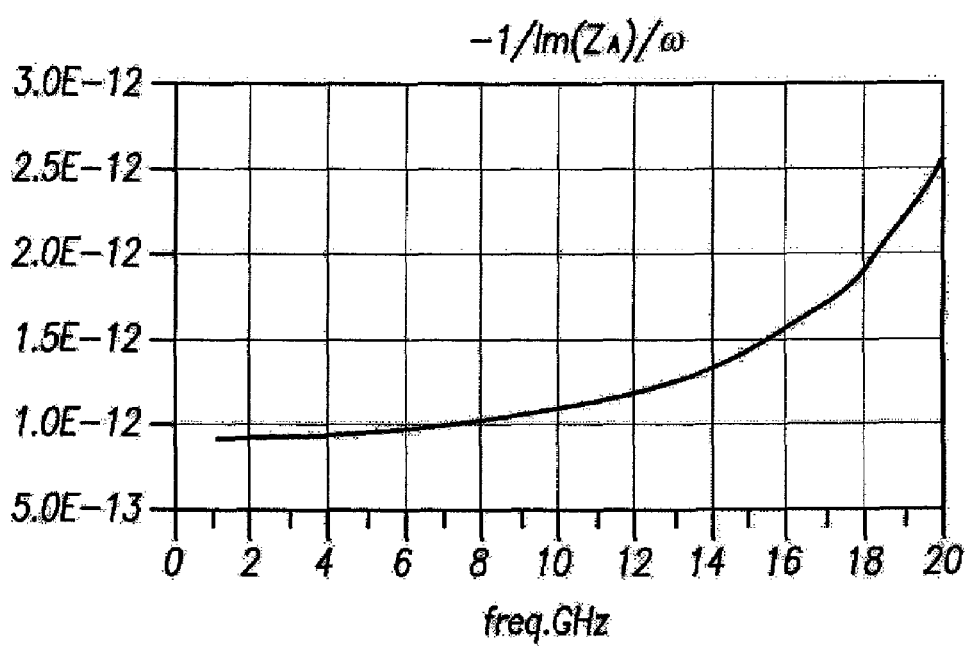

Example FIG. 4B illustrates $-1/Im(Z_A)/\omega$ of port 1 gate impedance $Z_A$ obtained through a parameter direction extraction method, in accordance with embodiments.

Figure 5A:
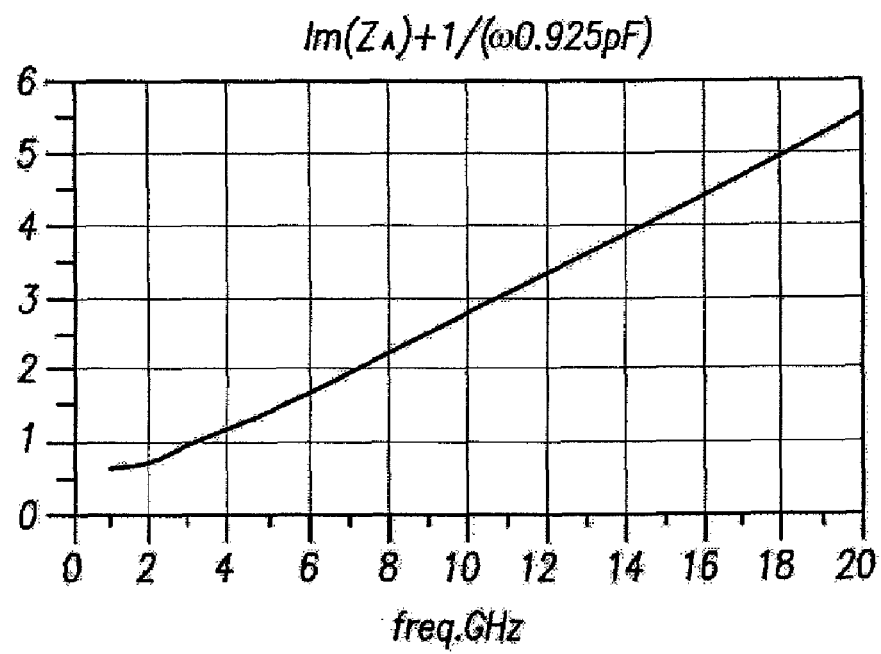
Figure 5B:
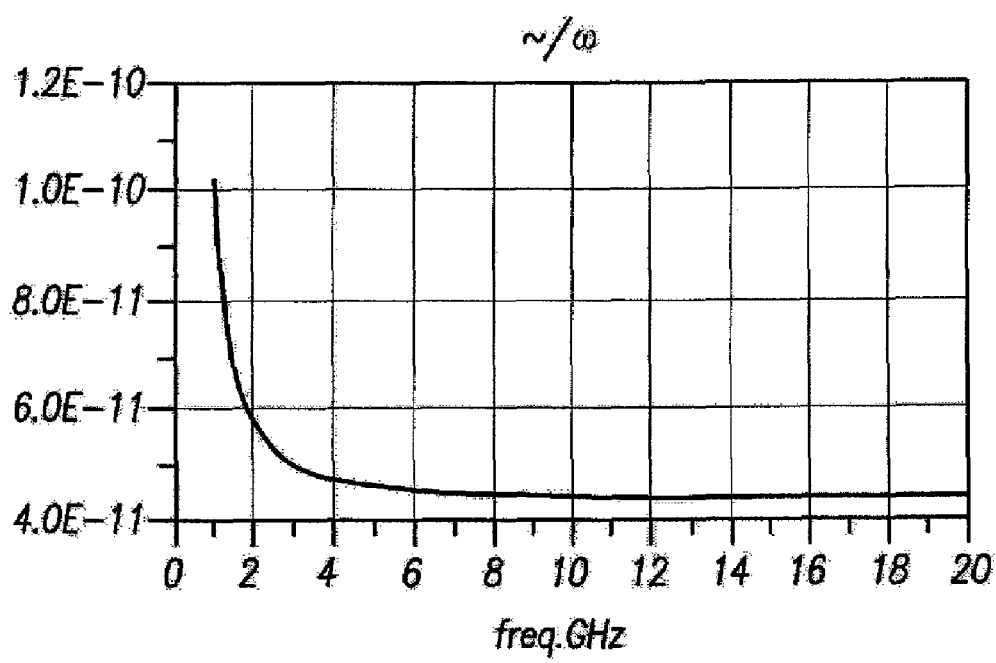
Figure 6A:
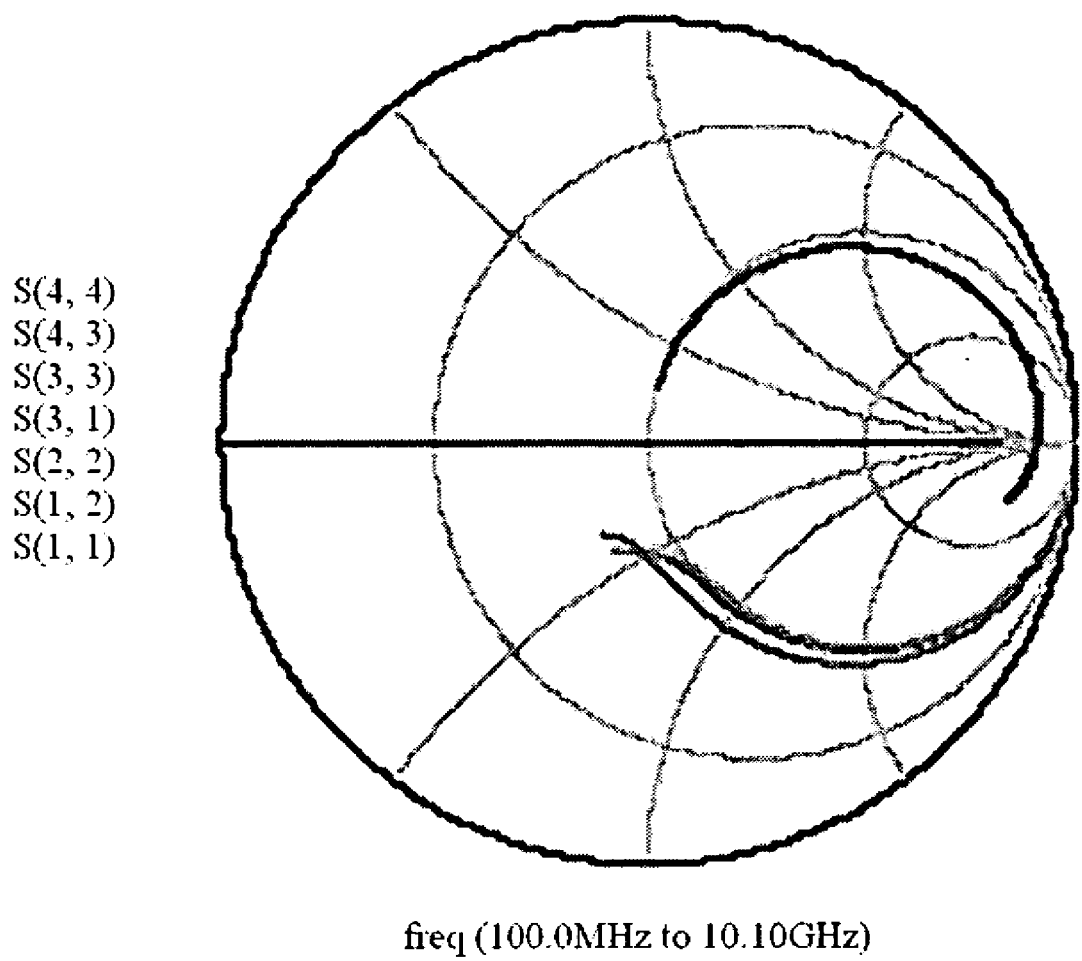
Figure 6B:
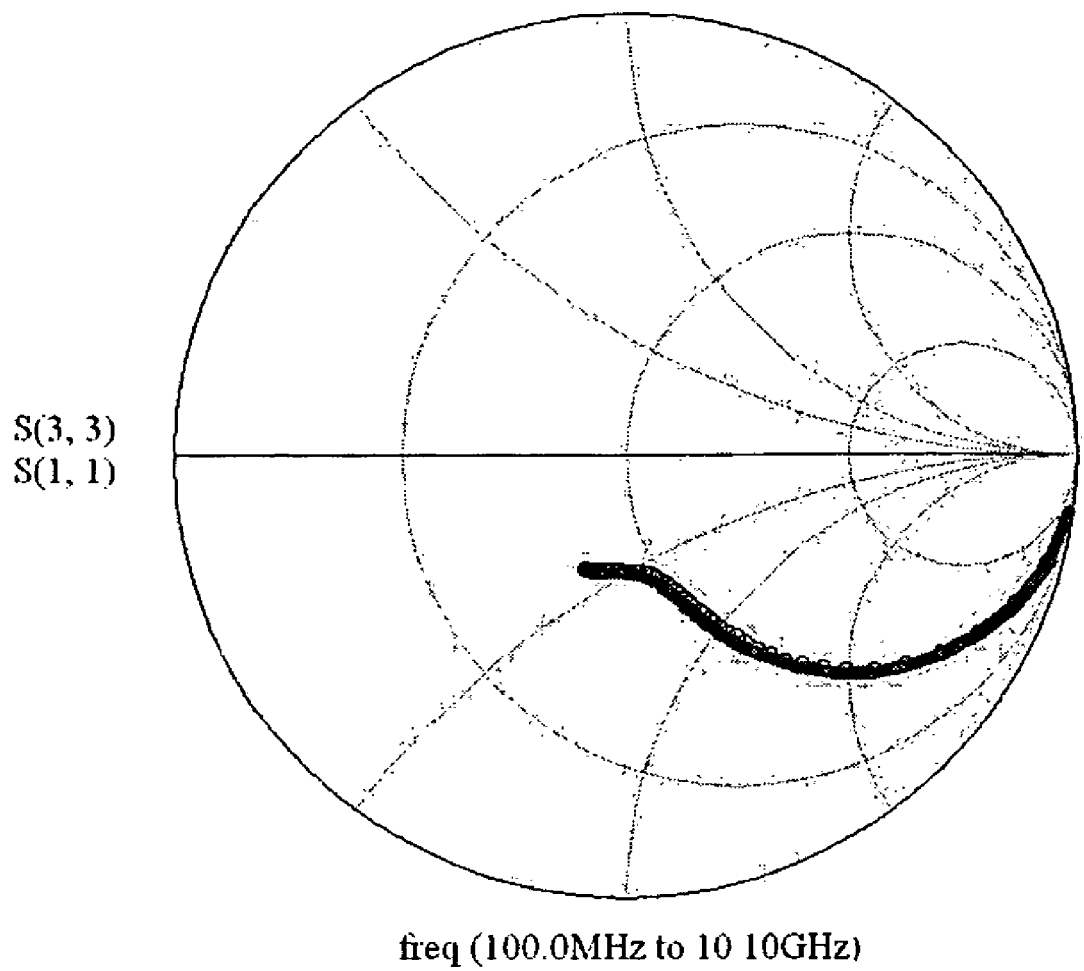
Figure 6C:
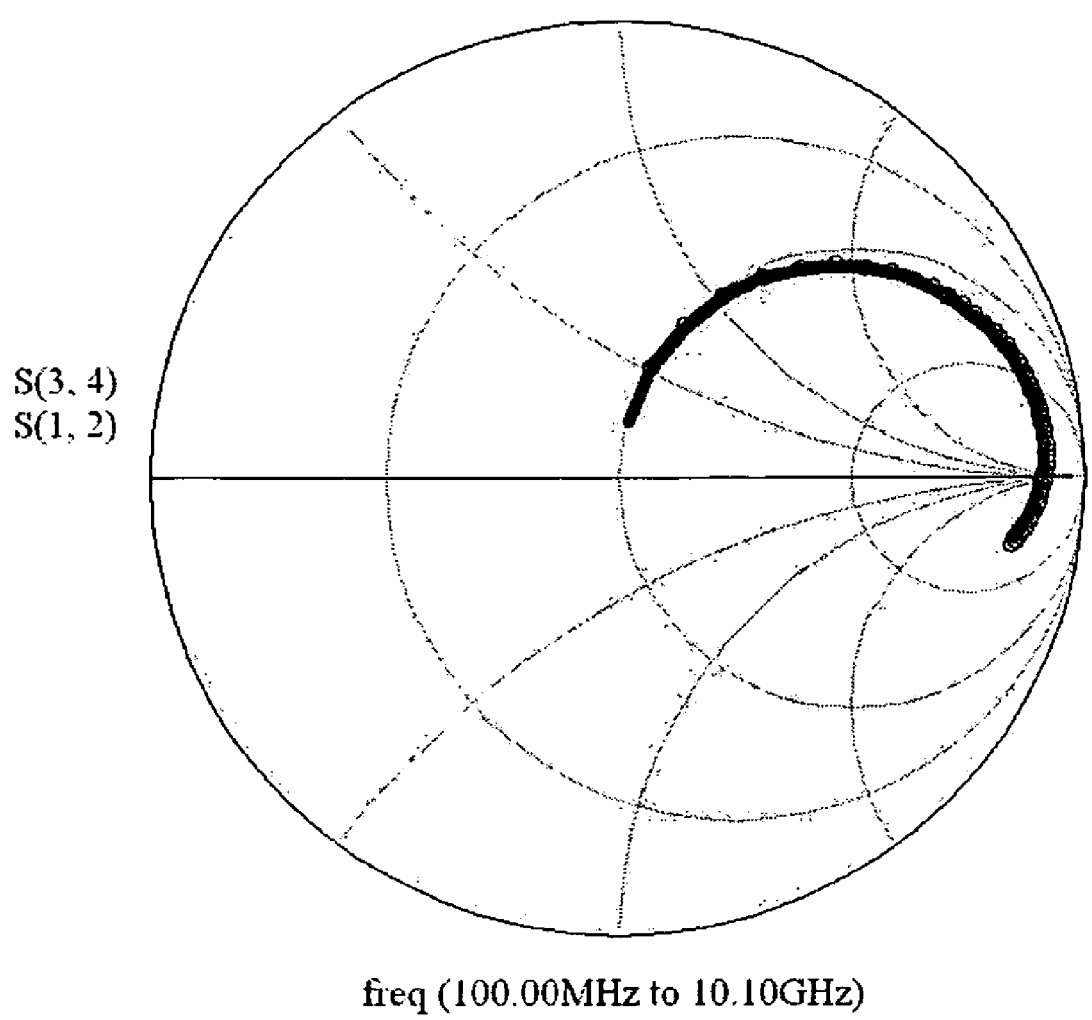
Figure 6D:
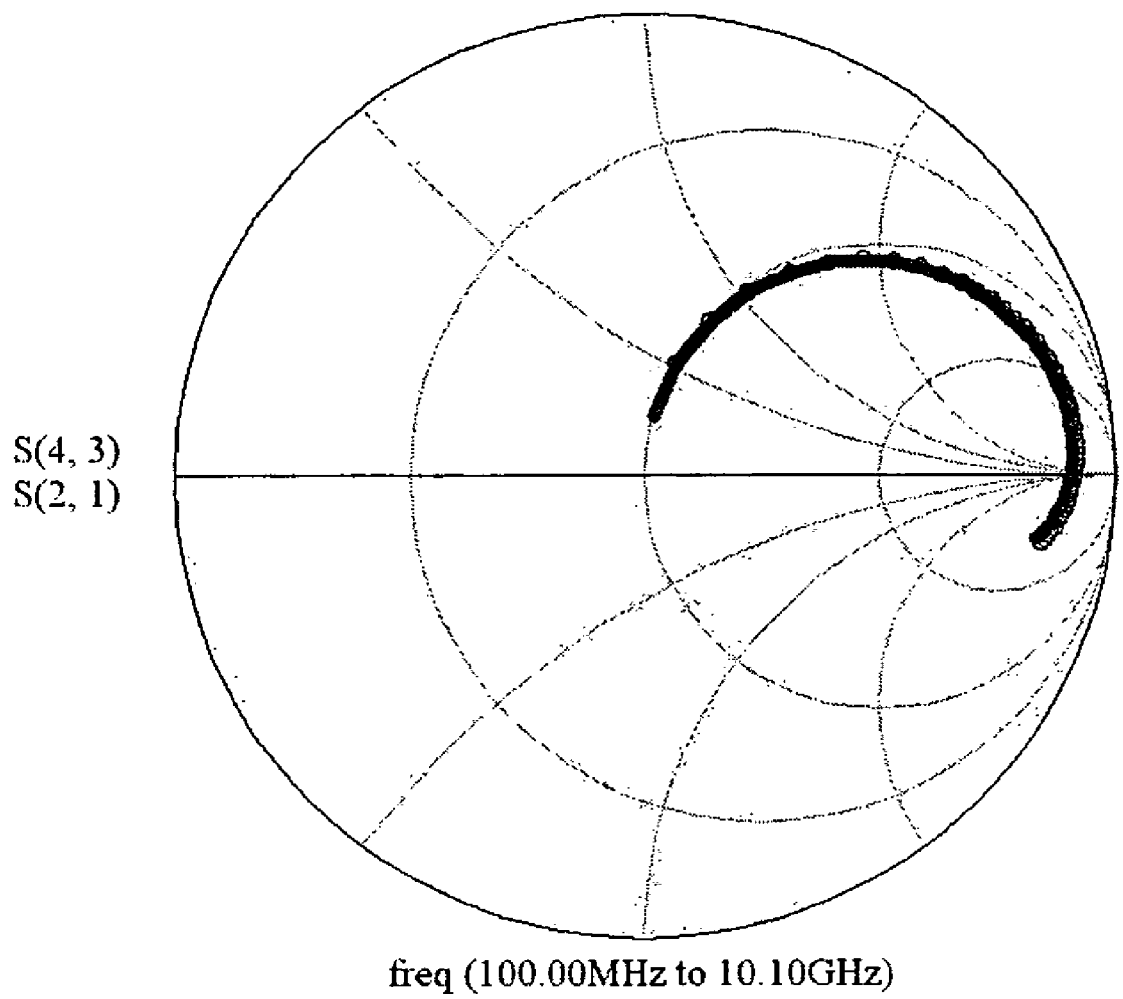
Figure 6E:
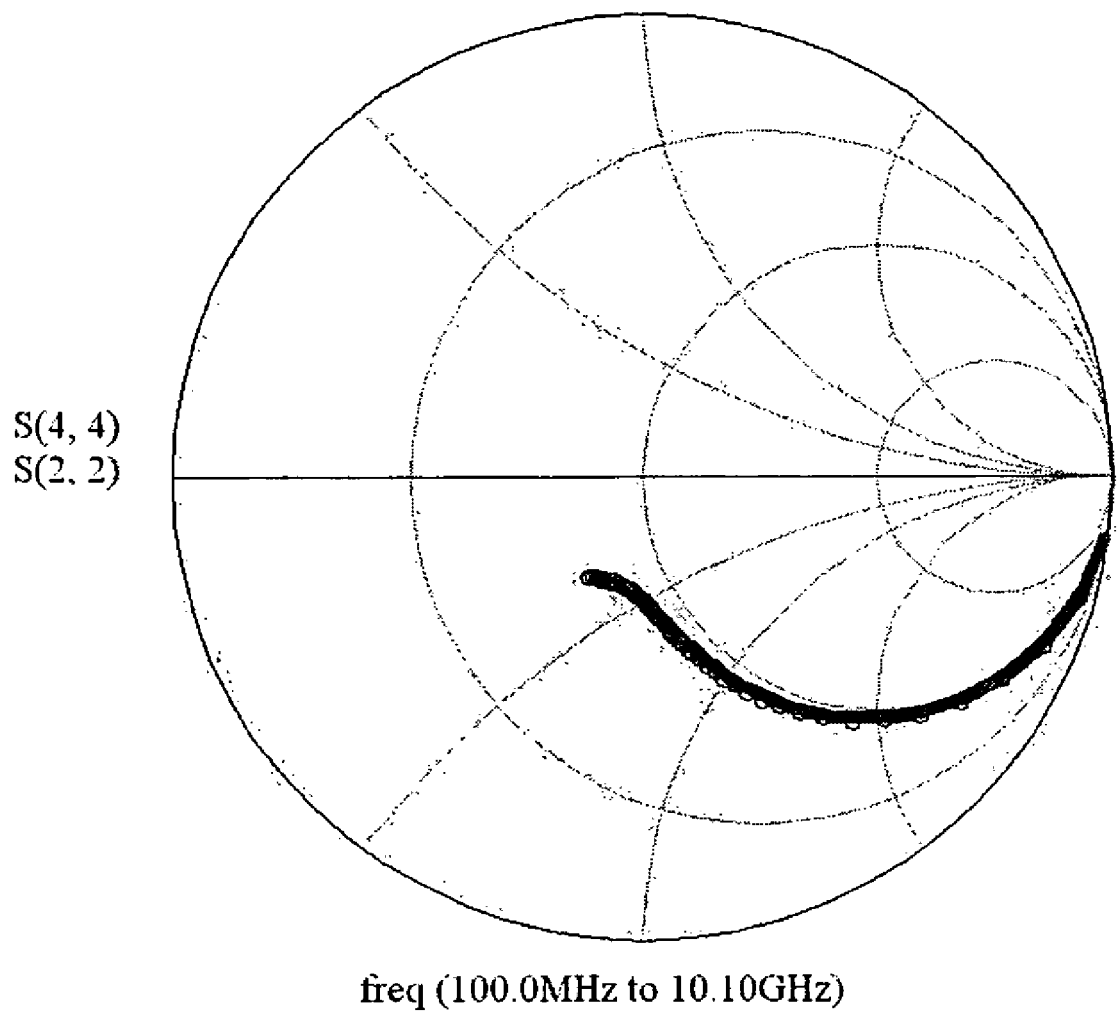
Figure 6F:
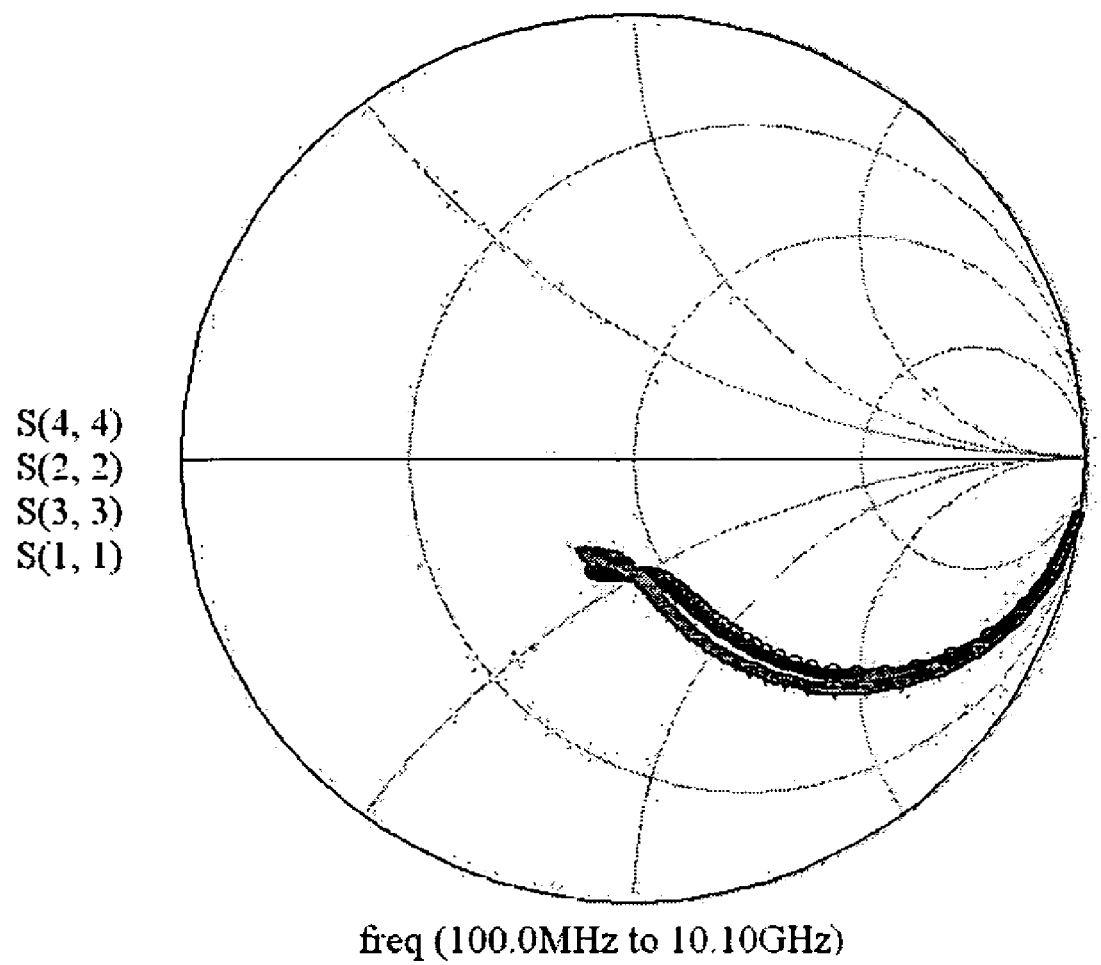
Figure 6G:
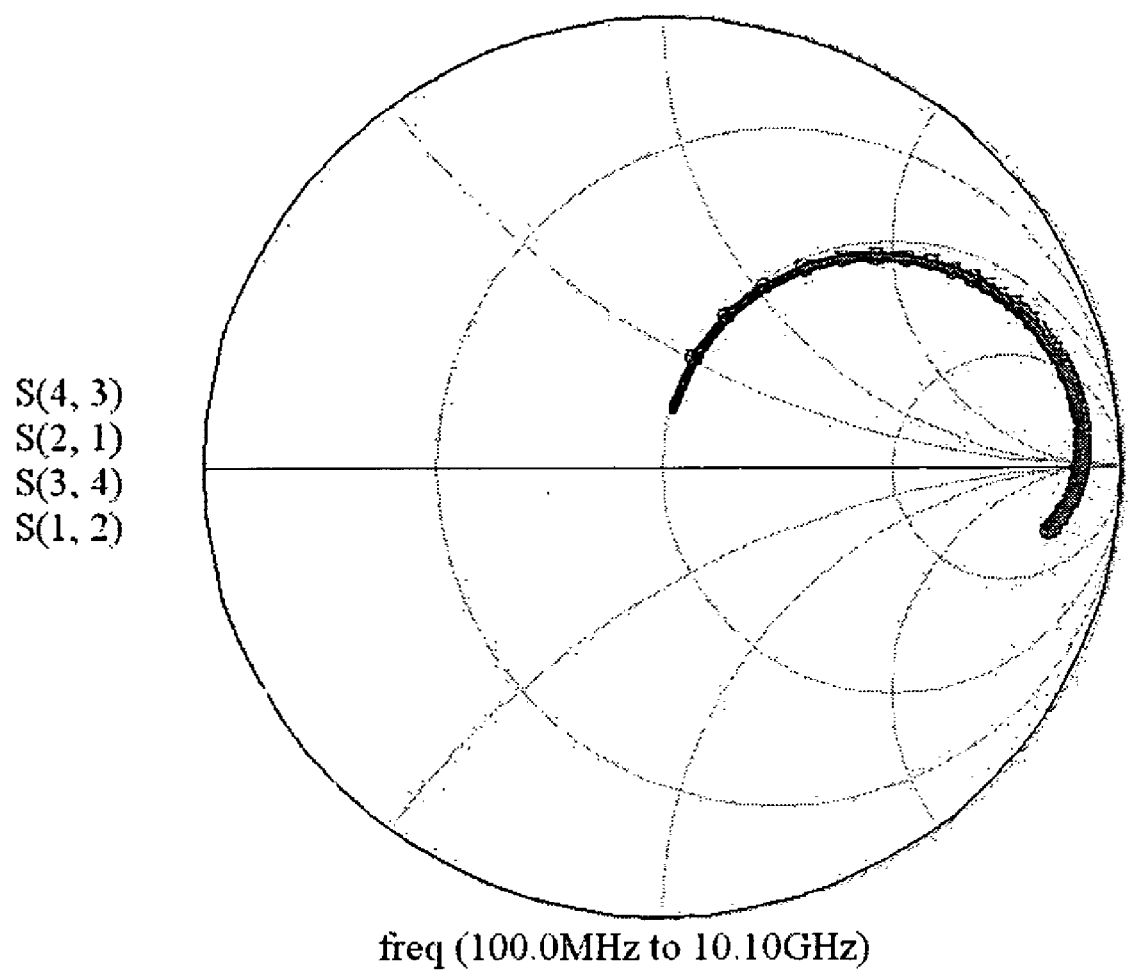

Example FIGS. 5A and 5B illustrates the parameters in question for obtaining $L_{gate}$ through a parameter direction extraction method in accordance with embodiments.

Example FIGS. 6A to 6G illustrate an s-parameter plot from a comparison of an s-parameter obtained through a parameter direction extraction method in accordance with embodiments and an s-parameter obtained through a measurement using measurement equipment.

DESCRIPTION

As illustrated in example FIGS. 1 and 2, MOS varactor 10 can be formed of a structure (i.e., a branch) including a pair of MOS capacitors 20 formed on and/or over a semiconductor substrate such as p-type semiconductor substrate 12. Each MOS capacitor can include gate insulating film 22 formed on and/or over semiconductor substrate 12 and gate electrode 24 formed on and/or over gate insulating film 22. A pair of spacers 25 can be formed on sidewalls of gate insulating film 22 and gate electrode 24. Source 26 and drain 28 can be formed under sidewalls 25 in an n+ area of semiconductor substrate 12.

P-type substrate 12 can be connected to a ground through p+ region 14. Gate electrode 24 may be connected to common gate electrode (Gate) which is Port 1. Source 26 and drain 28 can be electrically connected to bulk terminal (Bulk). The bulk terminal in MOS varactor 10 having a 2-port network structure can be connected to ground through the P-type substrate 12.

As illustrated in example FIG. 2, in an equivalent circuit diagram, $L_{gate}$ can serve as an overall inductance of Port 1 via and a gate. $R_{gate}$ can serve as a unit cell via/contact resistance of Port 1 and the gate. $C_{par}$ can serve as a parasitic capacitance of the varactor while $C_{gate}$ can serve as a variable capacity of a MOS-type variable capacitance. $R_{sd}$ can serve as a unit cell via/contact resistance of Port 2 and a bulk. $L_{sd}$ can serve as an overall inductance of Port 2 via and the bulk terminal. $D_{nwpsub}$ can serve as a diode provided between an N-well and P-type substrate 12. $R_{sub}$ can serve as a resistor for P-type substrate 12 and $C_{sub}$ can serve as a capacitor of P-type substrate 12.

$C_{gate}$ can be represented by equation 1 below, wherein $C_{gmin}$ is capacitance in the largest reverse bias, $dC_g$ is capacity coefficient, $V_g$ is potential difference across $C_{gate}$, and $dV_g$ and $V_{gnorm}$ are voltage coefficient.

$$C_{gate} = C_{gmin} + dC_g \times [1 + \tan h[(V_g - dV_g)/V_{gnorm}]] \quad (1)$$

In accordance with embodiments, the following fact and devises can be provided in a method for modeling the varactor using a direct extraction method based on the fact.

First, unlike an inductor that requires the accurate modeling of the substrate in order to make Q index large since the loss due to the substrate is large, the varactor in accordance with embodiments has a sufficiently large Q index and the influence of the characteristics of the substrate on the characteristics of the varactor is relatively small.

Secondly, for the varactor in accordance with embodiments, Rgate can serve as a resistance component by way of a polysilicon regardless of a gate bias. Third, $L_{gate}$ can have an inductance value through the gate connection. Fourth, $C_{ox}$ can serve as a capacitor by way of a gate insulating film (oxide film). Fifth, $C_{gate}$ can serve as a capacitor made by way of a depletion layer, whereby its value can be very small in a depletion state. However, when the accumulation state by the increase of voltage, its value can be large. Sixth, $R_{sd}$ can be represented by channel resistance from the source to the depletion layer. Lastly, the real component of Port 1 gate impedance $Z_A$ and Port 2 bulk impedance $Z_B$ can be high in frequency dependence.

In order to obtain Port 1 impedance $Z_A$, Port 2 impedance $Z_B$ and substrate impedance $Z_C$ in the measured s-parameter, when transforming the measured s-parameter into a y-parameter and a z-parameter and then using the following equations 2 to 8 devised in accordance with embodiments, the values of $R_{gate}$, $C_{var}$, $L_{gate}$, $R_{sd}$, and $L_{sd}$ can be directly extracted without separately using an expensive CAD tool. Herein, the parameter $C_{var}$ can be formed of Cgate and Cpar as illustrated in example FIG. 2. Parasitic capacitance Cpar of the varactor can be associated with gate leakage current, whereby if this value is small enough to be disregarded, Cvar and Cgate can be the same.

$$\text{Re}(Z_A) = \text{Re}(Z_{11} - Z_{12}) = R_{gate} \quad (2)$$

$$\text{Im}(Z_A) = \text{Im}(Z_{11} - Z_{12}) = \omega L_{gate} - \frac{1}{\omega C_{var}} \quad (3)$$

$$\frac{1}{\text{Im}(Z_A)} = \frac{1}{\omega L_{gate} - \frac{1}{\omega C_{var}}} = \frac{-\omega C_{var}}{1 - \omega^2 L_{gate} C_{var}} \approx -\omega C_{var} \quad (4)$$

$$\text{Im}(Z_A) = \text{Im}(Z_{11} - Z_{12}) = \omega L_{gate} - \frac{1}{\omega C_{var}} \quad (5)$$

$$\text{Im}(Z_A) + \frac{1}{\omega C_{var}} \omega L \quad (6)$$

$$\text{Re}(Z_B) = \text{Re}(Z_{22} - Z_{12}) = R_{sd} \quad (7)$$

$$\text{Im}(Z_B) = \text{Im}(Z_{22} - Z_{12}) = j\omega L_{sd} \quad (8)$$

In the above equations 2 to 8, $Z_{11}$, $Z_{12}$, $Z_{21}$, and $Z_{22}$ can be values obtained by transforming the s-parameter obtained by measurement equipment such as a vector network analyzer, where $\omega$ can be a constant and $C_j$ can be junction capacitance between the n+ area and the p-type substrate.

The $R_{gate}$ of parameters directly extracted using the above equations 2 to 8 is illustrated in example FIGS. 3A and 3B, the $C_{var}$ is illustrated in example FIGS. 4A and 4B, and $L_{gate}$ is illustrated in FIGS. 5A and 5B.

The real component and imaginary component of substrate impedance Zc can be represented by the following equations:

$$\text{Re}(Z_C) = \text{Re}(Z_{12}) = \frac{R_{sub}}{1 + \omega^2 R_{sub}^2 C_{sub}^2} \quad (9)$$

$$\frac{-1}{\text{Im}(Z_C)} = \frac{\omega C_j + \omega^3 R_{sub}^2 C_{sub}^2 C_j}{1 + \omega^2 R_{sub}^2 C_{sub}(C_{sub} + C_j)} \quad (10)$$

In a low frequency area of equation 10, $R_{sub}$ can be obtained and thus, $C_{sub}$ can be obtained using equation 11.

The varactor illustrated in example FIG. 1 can be manufactured using a 0.13 μm CMOS process, whereby the varactor can be structured in a comb structure in order to reduce serial parasitic resistance. In the manufactured varactor in accordance with embodiments, a line width of metal can be 2.5 μm, its length can be 2 μm, a branch can be 1, and $N_f$ can be 32. In such a varactor and which is in a wafer state, the s-parameter can be measured from 100 MHz to 10.1 GHz using an E8361A vector network analyzer and a cascade RF probe. Since the parasitic component is included in the wafer state, a two-step de-embedding can be performed to correct this.

As illustrated in example FIGS. 6A to 6G, the comparison result of the s-parameter measured on the varactor manufactured in accordance with embodiments and the parameters directly extracted through equations 2 to 11. Parameters S(4,4), S(4,3), S(3,3), S(3,1) are parameters directly extracted through the equations provided in accordance with embodiments and parameters S(2,2), S(2,1), S(1,2), S(1,1) are values measured by way of the equipment under the conditions described above.

As illustrated in the s-parameter plot of example FIGS. 6A to 6G, the parameters directly extracted in accordance with embodiments can be conformed to the measured parameters.

In accordance with embodiments, the modeling can be made reflecting the parameters of the varactor varied according to frequency so that a more accurate RF modeling of a passive device can be made. Also, an accurate modeling of the varactor can be made through the direct extraction method of the parameters so that the parameters of the varactor having a physical meaning can be extracted without using an expensive CAD tool and the time required for optimizing the parameters can be reduced. Finally, since embodiments can include the direct extraction method of the parameters, a computing time can be shortened, an initial condition dependency generated in performing the optimization is not required, and a pattern for a test is not required.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:

using a processor to perform steps of:

providing MOS varactor including a gate, a source, and a drain formed over a p-type semiconductor substrate, calculating a first port gate impedance $Z_A$, a second port bulk impedance $Z_B$ and a substrate impedance $Z_C$ in a measured s-parameter using a first model equation $$Re(Z_A)=Re(Z_{11}-Z_{12})=R_{gate}$$

and a second model equation $$Im(Z_A) = Im(Z_{11} - Z_{12}) = \omega L_{gate} - \frac{1}{\omega C_{var}},$$

where $L_{gate}$ represents the overall inductance of the first port via and the gate, $R_{gate}$ represents a unit cell via/contact resistance of the first port and the gate, and $C_{var}$ is formed of Cgate and $C_{par}$, where $C_{gate}$ represents a variable capacity of a MOS-type variable capacitance and $C_{par}$ represents a parasitic capacitance of the varactor, parameters $Z_{11}$ and $Z_{12}$ are values obtained by transforming the measured s-parameter, and ω is a constant.

2. The method of claim 1, wherein Cvar is directly extracted from equations:

$$\frac{1}{Im(Z_A)} = \frac{1}{\omega L_{gate} - \frac{1}{\omega C_{var}}} = \frac{-\omega C_{var}}{1 - \omega^2 L_{gate} C_{var}} \approx -\omega C_{var},$$

$$Im(Z_A) = Im(Z_{11} - Z_{12}) = \omega L_{gate} - \frac{1}{\omega C_{var}}, \text{ and}$$

$$Im(Z_A) + \frac{1}{\omega C_{var}} = \omega L.$$

3. The method of claim 2, wherein the parameters Rsub and Csub are extracted from equations:

$$Re(Z_C) = Re(Z_{12}) = \frac{R_{sub}}{1 + \omega^2 R_{sub}^2 C_{sub}^2} \text{ and}$$

$$\frac{-1}{Im(Z_C)} = \frac{\omega C_j + \omega^3 R_{sub}^2 C_{sub}^2 C_j}{1 + \omega^2 R_{sub}^2 C_{sub}(C_{sub} + C_j)},$$

where $C_j$ is a junction capacitance between a n-type region in the semiconductor substrate area and the p-type semiconductor substrate.

4. The method of claim 1, wherein parameters Rsd, Lsd, and Lgate are directly extracted from equations:

$$Re(Z_B)=Re(Z_{22}-Z_{12})=R_{sd} \text{ and } Im(Z_B)Im(Z_{22}-Z_{12})=j\omega L_{sd},$$

where $R_{sd}$ represents a unit cell via/contact resistance of the second port and a bulk terminal, $L_{sd}$ represents an overall inductance of the second port via and the bulk terminal, $L_{gate}$ represents an overall inductance of the first port via and the gate and $Z_{21}$ and $Z_{22}$ are values obtained by transforming the measured s-parameter.

5. The method of claim 2, wherein parameters Rsd, Lsd, and Lgate are directly extracted from equations:

$$Re(Z_B)Re(Z_{22}-Z_{12})=R_{sd} \text{ and } Im(Z_B)=Im(Z_{22}-Z_{12})=j\omega L_{sd}.$$

6. The method of claim 5, wherein parameters Rsub and Csub are directly extracted from equations:

$$Re(Z_C) = Re(Z_{12}) = \frac{R_{sub}}{1 + \omega^2 R_{sub}^2 C_{sub}^2} \text{ and}$$

$$\frac{-1}{Im(Z_C)} = \frac{\omega C_j + \omega^3 R_{sub}^2 C_{sub}^2 C_j}{1 + \omega^2 R_{sub}^2 C_{sub}(C_{sub} + C_j)},$$

where $C_j$ is a junction capacitance between a n+-type region in the semiconductor substrate area and the p-type semiconductor substrate.

7. The method of claim 4, wherein the parameters Rsub and Csub are directly extracted from equations:

$$Re(Z_C) = Re(Z_{12}) = \frac{R_{sub}}{1 + \omega^2 R_{sub}^2 C_{sub}^2} \text{ and}$$

$$\frac{-1}{Im(Z_C)} = \frac{\omega C_j + \omega^3 R_{sub}^2 C_{sub}^2 C_j}{1 + \omega^2 R_{sub}^2 C_{sub}(C_{sub} + C_j)},$$

where $C_j$ is a junction capacitance between a n+-type region in the semiconductor substrate area and the p-type semiconductor substrate.

8. The method of claim 1, wherein the parameters Rsub and Csub are extracted from equations:

$$Re(Z_C) = Re(Z_{12}) = \frac{R_{sub}}{1 + \omega^2 R_{sub}^2 C_{sub}^2} \text{ and}$$

$$\frac{-1}{Im(Z_C)} = \frac{\omega C_j + \omega^3 R_{sub}^2 C_{sub}^2 C_j}{1 + \omega^2 R_{sub}^2 C_{sub}(C_{sub} + C_j)},$$

where $C_j$ is a junction capacitance between a n+-type region in the semiconductor substrate area and the p-type semiconductor substrate.

9. The method of claim 1, wherein Rgate comprises a resistance component by way of a polysilicon regardless of a gate bias.

10. The method of claim 1, wherein $L_{gate}$ has an inductance value through a gate connection.

11. The method of claim 1, wherein $C_{gate}$ comprises a capacitor made by way of a depletion layer, whereby its value can be very small in a depletion state.

12. The method of claim 1, wherein $R_{sd}$ comprises a channel resistance from the source to the depletion layer.

13. The method of claim 1, wherein $Z_A$ and $Z_B$ are high in frequency dependence.

14. A method, using a processor, for modeling a MOS varactor including a gate, a source, and a drain formed over a p-type semiconductor substrate, the varactor having parameters including a first port gate impedance $Z_A$ and a second port bulk impedance $Z_B$, a substrate impedance $Z_C$, a parameter $R_{gate}$ representing a unit cell via/contact resistance of the first port and the gate that are directly extracted from the following model equations;

$$Re(Z_A) = Re(Z_{11} - Z_{12}) = R_{gate},$$

$$Im(Z_A) = Im(Z_{11} - Z_{12}) = \omega L_{gate} - \frac{1}{\omega C_{var}},$$

$$Re(Z_B) = Re(Z_{22} - Z_{12}) = R_{sd},$$

$$Im(Z_B) = Im(Z_{22} - Z_{12}) = j\omega L_{sd},$$

-continued $$Re(Z_C) = Re(Z_{12}) = \frac{R_{sub}}{1+\omega^2 R_{sub}^2 C_{sub}^2}, \text{ and}$$

$$\frac{-1}{Im(Z_C)} = \frac{\omega C_j + \omega^3 R_{sub}^2 C_{sub}^2 C_j}{1+\omega^2 R_{sub}^2 C_{sub}(C_{sub}+C_j)},$$

where $L_{gate}$ represents the overall inductance of the first port via and the gate, $R_{gate}$ represents the unit cell via/contact resistance of the first port and the gate, $C_{par}$ represents a parasitic capacitance of the varactor, $C_{gate}$ represents a variable capacity of variable capacitance, $R_{sd}$ represents a unit cell via/contact resistance of the second port and a bulk terminal, $L_{sd}$ represents an overall inductance of the second port via and the bulk terminal, $R_{sub}$ represents a resistance of the p-type semiconductor substrate, and $C_{sub}$ represents a capacitance of the p-type semiconductor substrate.

15. The method of claim 14, wherein the parameter $C_{var}$ is directly extracted from the following model equations:

$$\frac{1}{Im(Z_A)} = \frac{1}{\omega L_{gate} - \frac{1}{\omega C_{var}}} = \frac{-\omega C_{var}}{1-\omega^2 L_{gate} C_{var}} \approx -\omega C_{var},$$

$$Im(Z_A) = Im(Z_{11}-Z_{12}) = \omega L_{gate} - \frac{1}{\omega C_{var}}, \text{ and}$$

$$Im(Z_A) + \frac{1}{\omega C_{var}} = \omega L.$$

16. The method of claim 15, wherein the parameters $R_{sd}$, $L_{sd}$, and $L_{gate}$ are directly extracted from the following model equations:

$$Re(Z_B) = Re(Z_{22}-Z_{12}) = R_{sd}, \text{ and}$$

$$Im(Z_B) = Im(Z_{22}-Z_{12}) = j\omega L_{sd}.$$

17. The method of claim 15, wherein the parameters $R_{sub}$ and $C_{sub}$ are extracted from the following model equations:

$$Re(Z_C) = Re(Z_{12}) = \frac{R_{sub}}{1+\omega^2 R_{sub}^2 C_{sub}^2}, \text{ and}$$

$$\frac{-1}{Im(Z_C)} = \frac{\omega C_j + \omega^3 R_{sub}^2 C_{sub}^2 C_j}{1+\omega^2 R_{sub}^2 C_{sub}(C_{sub}+C_j)}.$$

18. The method of claim 14, wherein the parameters $R_{sub}$ and $C_{sub}$ are directly extracted from the following model equations:

$$Re(Z_C) = Re(Z_{12}) = \frac{R_{sub}}{1+\omega^2 R_{sub}^2 C_{sub}^2}, \text{ and}$$

$$\frac{-1}{Im(Z_C)} = \frac{\omega C_j + \omega^3 R_{sub}^2 C_{sub}^2 C_j}{1+\omega^2 R_{sub}^2 C_{sub}(C_{sub}+C_j)}.$$

* * * * *